United States Patent [19]

Pastor et al.

[11] Patent Number: 4,847,053
[45] Date of Patent: Jul. 11, 1989

[54] GROWTH OF GLASS-CLAD SINGLE CRYSTAL FIBERS

[75] Inventors: Antonio Pastor, Santa Monica; Gregory L. Tangonan, Oxnard, both of Calif.

[73] Assignee: Hughes Aircraft Company, Los Angeles, Calif.

[21] Appl. No.: 46,015

[22] Filed: May 5, 1987

[51] Int. Cl.⁴ ............................................. C30B 35/00
[52] U.S. Cl. ................................... 422/249; 422/246; 422/248; 422/254
[58] Field of Search ......... 156/616 R, 624, DIG. 113, 156/616.1–616.41; 422/245, 246, 248, 249, 254; 65/3.11, 3.13; 260/707, DIG. 23; 350/96.29, 96.34

[56] References Cited

U.S. PATENT DOCUMENTS

| | | | |
|---|---|---|---|
| 2,149,076 | 2/1939 | Stockbarger | 156/616 R |
| 3,607,137 | 9/1971 | Inoguchi et al. | 156/616 R |
| 4,077,699 | 3/1978 | Dyott et al. | 350/96.34 |
| 4,181,515 | 1/1980 | Dyott et al. | 156/616 R |
| 4,605,468 | 8/1986 | Pastor | 156/608 |

OTHER PUBLICATIONS

Pamplin, B., "Crystal Growth", 2nd Edition, Pergamon Press, 1980, pp. 6–9.

Primary Examiner—John Doll
Assistant Examiner—R. Bruce Breneman
Attorney, Agent, or Firm—Wanda K. Denson-Low; A. W. Karambelas

[57] ABSTRACT

Fine single crystals of low-melting point materials are prepared by slowly withdrawing a glass crystal growth capillary tube containing the material from a heating apparatus which precisely maintains the molten material at a temperature just above its melting point. Temperature control of the molten material in the crystal growth tube, prior to solidification, is attained by enclosing the crystal growth tube in a temperature control tube containing the molten material being solidified. Preferably, the inside diameter of the temperature control tube is slightly larger than the outside diameter of the crystal growth tube, and both tubes reach into a reservoir of the molten material to be grown as a crystal, so that the molten material is drawn upwardly into the crystal growth tube and the space between the crystal growth tube and the temperature control tube by capillary action.

13 Claims, 1 Drawing Sheet

GROWTH OF GLASS-CLAD SINGLE CRYSTAL FIBERS

BACKGROUND OF THE INVENTION

This invention relates generally to the growth of single crystals, and, more particularly, to the growth of fine single crystal fibers enclosed in a glass cladding.

The atoms or molecules of many materials solidify in regular arrangments called crystals, wherein a basic structural arrangement of the atoms or molecules is repeated to form the solid. Due to the mode of growth, and possibly due to subsequent processing, the majority of crystalline materials familiar to most persons develop as polycrystals. Polycrystals are essentially islands of single-crystal material bonded together at interfaces called grain boundaries, to form a solid. Single crystals, wherein an entire solid forms with one crystalline orientation and without grain boundaries, can be prepared under carefully controlled conditions and with special attention and care.

In certain applications, single crystals offer important advantages over polycrystals in respect to the properties that can be attained. In one particular field, optics, properly oriented single crystals of small size can be used to modify the properties of the light passing through the single crystals in a manner not possible with polycrystals due to their multiplicity of crystallographic orientations and internal scattering of the light. Devices incorporating such single crystals are used in optical circuits that transmit and process light.

In one particular type of application, fine single crystals of optically nonlinear materials are the key components of optical processing devices that alter the frequency of light passed through the devices. Certain optically nonlinear single crystal materials permit frequency adding, frequency subtracting, frequency doubling, and the like. To cite one example, two frequencies of light can be added by a single crystal of $KNbO_3$. If infrared light having a wagvelength of 0.82 micrometers, and infrared light having a wavelength of 0.83 micrometers, are simultaneously introduced into one end of the single crystal, blue light having a wavelength of 0.42 micrometers is emitted at the other. In such an application, the crystal visibly indicates a frequency shift between two beams.

The single crystals of optically nonlinear materials are made very fine in diameter, to achieve high efficiency and so that they can be built into optical processing circuits as components. The optical fiber transmission lines used in such circuits are typically very fine, on the order of 0.001 inch or less in diameter. It is therefore particularly desirable to have the optical processing components such as the single crystals of optical nonlinear materials of a similar size, so that they can be interfaced directly to the optical fibers and to other components.

The optically nonlinear materials having melting points on the order of about 100° C. are typically organic single crystals. To achieve the desired results, the single crystals should have lengths many times that of their diameters, as with a length to diameter ratio of over 1000. As a result, fine fibers of such materials are easily broken, and even normal handling and use may cause breakage. Special care must therefore be taken to protect the fine fibers during growth, handling, and use.

In one technique, the fine single crystals are formed inside a hollow glass tube. Once formed, each single crystal remains inside its tube during use, so that the tube protects and supports the crystal. The composition and dimensions of the glass tube are selected so as not to interfere with the functioning of the optically active single crystal.

The single crystal is grown inside the glass tube by placing the glass tube into a vertical orientation and lowering it into a reservoir of the molten single crystal material maintained at a temperature just above the melting point of the material. The molten material rises in the tube by capillary action, and the tube is then slowly withdrawn upwardly, causing the molten material to solidify as a crystal at the emerging end of the tube. Since the molten material in the tube rises under the capillary action, the solidification of the optical crystal material inside the glass tube occurs at a point that is typically several inches above the surface of the reservoir.

To avoid premature solidification and achieve unidirectional solidification of the crystal, the molten material that has risen by capillary action must be maintained above its melting point over its entire height rise. Moreover, the temperature at the point of solidification must be maintained constant to within one degree Celsius over long periods of time. The glass tube is moved upwardly at a rate of only about one inch per hour or less, and the time required to grow a long single crystal is typically several hours. If the temperature of the solidification is permitted to vary significantly during that period, there will be lengthwise inhomogeneities grown into the crystal. Such inhomogeneities interfere with the ability of the finished crystal to perform its optical functions.

It has been the prior practice to maintain the temperature constant at the point of solidification of the crystal by drawing the glass tube through a constant temperature bath, such as an oil bath. The bath has a large thermal mass and is heated by resistance heaters. It has been thought that such a bath stabilizes the temperature at the point of solidification sufficiently to produce a good quality optical crystal.

It has now been observed that the use of a constant temperature bath of the conventional type actually creates undesirable temperature variations, since varying temperature distributions are established in the bath. The convection currents of the bath circulate hot bath liquid, causing the temperature variations. Even though the variations are relatively small, the result is that the finished crystal exhibits lengthwise inhomogeneities that are detrimental to their optical performance. Further, since the material of the constant temperature bath is selected as unrelated to the crystal being grown, there is no inherent stabilization of the bath temperature near to the melting point of the optical crystal.

There therefore exists a need for a better method and apparatus for growing fine single crystals in glass tubes. The approach should achieve a very high degree of temperature stabilization at the melting point of the crystal being grown, so that the temperature can be maintained over extended periods. The present invention fulfills this need, and further provides related advantages.

SUMMARY OF THE INVENTION

The present invention resides in an apparatus and growth method for preparing single crystals of small diameter within a glass tube cladding that supports and protects the single crystal. The approach permits the growth of long crystals having minimal lengthwise growth inhomogeneities, because the temperature of the crystal material just prior to the point of solidification is maintained constant and at a value stabilized just above the melting point of the crystal. The apparatus is readily constructed, and can be used for the growth of a wide variety of crystalline materials. It is effective for growing fine diameter, high quality, optically nonlinear, organic crystals, as well as other types of encapsulated crystals.

In accordance with the invention, a crystal growing apparatus comprises a container having a crucible adapted for containing a supply of a growth material to be grown into a crystal, and a vertically elongated neck extending above the crucible; heating means for heating the contents of the container, the heating means including a first heater for the crucible and a second heater for the neck; a temperature control tube within the elongated neck and extending downwardly into the crucible; and a crystal growth tube within the elongated neck and the temperature control tube, the crystal growth tube being free to slide within the temperature control tube. A baffle box may be provided around the container and tubes to further stabilize the temperature against room drafts and the like. A retraction means is also provided to withdraw the crystal growth tube from the container at a controlled rate of withdrawal. Preferably, the container, temperature control tube, and growth tube are made of glass, when the apparatus is used to grow crystals of materials such as optically active organic materials having melting points on the order of 100° C.

More particularly, and in a preferred embodiment, a crystal growing apparatus comprises an enlarged container having a crucible adapted for containing a supply of a growth material to be grown into a crystal, and a vertically elongated neck extending above the crucible; a first heater comprising resistance wire wound around the outside surface of the crucible; a second heater comprising resistance wire wound around the outside surface of the elongated neck; a hollow cylindrical temperature control tube within the elongated neck and extending downwardly into the crucible, the temperature control tube being fixed to the neck at the upper end of the neck; a hollow cylindrical crystal growth tube disposed within the elongated neck and the temperature control tube, the crystal growth tube being free to slide within the temperature control tube, the spacing between the outer diameter of the crystal growth tube and the inner diameter of the temperature control tube being sufficiently small that a molten crystal material is drawn upwardly by capillary action into the space between the crystal growth tube and the temperature control tube; a crystal puller connected to said crystal growth tube, the crystal puller being adapted to withdraw the crystal growth tube from the temperature control tube at a constant rate of withdrawal; and a baffle box surrounding the container and having an opening in the top thereof so that the crystal growth tube and the temperature control tube extend therethrough.

Typically, the inner diameter of the crystal growth tube is less than about 0.001 inches, and the spacing between the outer diameter of the crystal growth tube and the inner diameter of the temperature control tube is less than about 0.005 inches. Optically active organic materials of interest in growing crystals include, but are not limited to, metanitroaniline, orthonitroaniline, 2,methyl-4,nitroaniline, benzil, and urea.

In the apparatus of the invention, the hollow crystal growth tube extends vertically downwardly through the neck of the container and into the crucible portion of the container. The hollow temperature control tube also extends vertically downwardly through the neck of the container. The temperature control tube has an inner diameter greater than the outer diameter of the crystal growth tube, and the crystal growth tube is placed inside the temperature control tube.

In operation, the crucible is heated to a temperature above melting point of the material to be grown into a crystal, and charged with a sufficient amount of the material to form a molten reservoir pool in the bottom of the crucible. The lower end of the crystal growth tube is immersed into the reservoir pool, and gradually removed from the reservoir during the growth process. The lower end of the temperature control tube is also immersed into the reservoir pool, and is maintained there during the growth process. The material from the reservoir pool rises into the crystal growth tube under capillary action to a height determined by the size of the crystal growth tube and the properties of the crystal growth material.

The lower end of the temperature control tube is also immersed in the reservoir pool, and maintained within the reservoir during the growth process. The material from the reservoir rises into the space between the outside surface of the crystal growth tube and the inside wall of the temperature control tube, to a height determined by the dimensions of the space between the tube and the properties of the material. Thus, a thin wall of the molten crystal growth material, in the space between the tubes, surrounds the crystal growth material contained within the crystal growth tube. The thin wall of molten crystal growth material is in thermal communication with the reservoir pool and the second heater, stabilizing the temperature of the material within the crystal growth tube. Convection currents cannot be formed within the small dimension of the thin wall of crystal growth material, eliminating this source of longitudinal temperature gradients. The thin wall of molten crystal growth material also lubricates the sliding of the crystal growth tube within the temperature control tube, reducing jerkiness in the growth apparatus that can cause irregularities in the grown crystal. Conventional crystal growers use mechanical bearings that can serve as the source of imperfections in the crystal.

This thin wall of liquid material captured in the space between the two tubes is effective in stabilizing the material within the crystal growth tube against both downward and upward fluctuations in temperature. Such fluctuations are potentially highly damaging to properties of the final crystal, as they would induce lengthwise irregularities into the solidifying crystal, and perhaps even result in remelting behind the solidification front or rapid solidification of large lengths of crystal.

In operation of the crystal growth apparatus, the material in the thin wall is at a temperature just above its melting point. If the temperature were to drop such that the material in the thin wall began to solidify, its heat of fusion would be released, thereby introducing heat to counter the temperature drop. The downward temperature fluctuation would be damped, thereby resulting in improved temperature control and perfection of the final crystal. This form of temperature stabilization is not possible with conventional constant temperature baths, which utilize a bath material having a melting point far below the crystal growth temperature. If the temperature were to rise with an upward fluctuation, the solidification front would be observed to stop or even recede, rather than advance. The thin wall of molten material shields the solidifying crystal from such upward fluctuations.

The temperatures in the neck and in the melting crucible are controlled separately, with two separate heaters. Accurate control is required, since the organic optically active materials are not chemically stable at temperatures considerably above their melting points. The neck temperature is maintained a few degrees above the temperature of the crucible. If this relationship were not maintained, there would be an increased likelihood of freezing of the crystal growth material in the neck die to the increased heat loss above that experienced in the crucible. If there is freezing or clogging of the growth apparatus in the neck portion, the problem cannot be remedied simply by raising the temperature of the neck heater, as there would be remelting of previously solidified crystal material and introduction of bubbles or vapor into the crystal. The remelting and vapor introduction introduce lengthwise irregularities, seriously impairing the quality of the finished crystal.

In accordance with the processing aspect of the invention, a process for growing crystals comprises the steps of furnishing a crystal growth apparatus comprising a container having a crucible adapted for containing a supply of a growth material to be grown into a crystal, and a vertically elongated neck extending above the crucible, heating means for heating the contents of the container, the heating means including a first heater for the crucible and a second heater for the neck, a temperature control tube within the elongated neck and extending downwardly into the crucible, and a crystal growth tube within the elongated neck and the temperature control tube, the crystal growth tube being free to slide within the temperature control tube; placing a supply of the growth material into the crucible; heating the melting crucible to the melting point of the growth material, and heating the neck to a temperature above that of the crucible, whereupon the liquefied growth material is drawn upwardly into the crystal growth tube and into the space between the temperature control tube and the crystal growth tube by capillary action; and withdrawing the crystal growth tube from the neck of the container to form a solidified mass of the growth material inside the crystal growth tube.

Crystals prepared by the approach of the invention are more suitable for use in many applications than are similar crystals grown by conventional techniques. The crystals of the present invention are more regular along their lengths, with fewer lengthwise irregularities and imperfections than conventional crystals.

It will now be appreciated that the approach of the present invention provides important advantages over conventional approaches for growing single crystals of small diameter within a glass cladding, from optically active organic materials. The present approach offers more precise temperature control in the regions adjacent the growth interface, resulting in more perfect final crystals. Although the preferred use of the present invention is in the growth of such optically active organic crystals, its use is not so limited. Other features and advantages of the present invention will be apparent from the following more detailed description, taken in conjuction with the accompanying drawing, which illustrates, by way of example, the principles of the invention.

DETAILED DESCRIPTION OF THE PREFERRED EMBODIMENT

Figure 1:
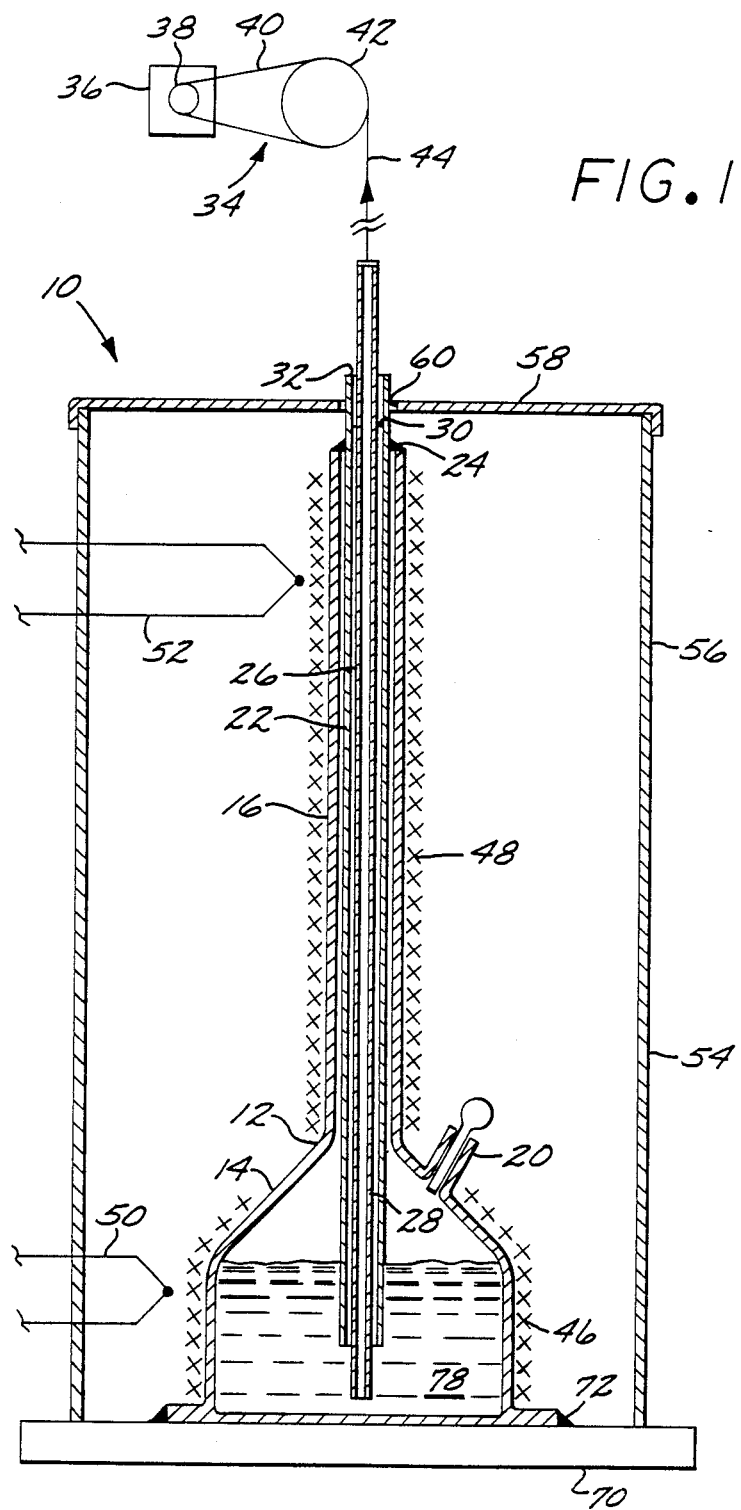
FIG. 1 is a side sectional view of the preferred form of the growth apparatus of the invention.

The apparatus of the present invention is embodied in a crystal growing apparatus 10, illustrated in FIG. 1. The apparatus 10 includes a container 12 having two parts, a crucible 14 and a neck 16. The crucible 14 is an enlarged container that holds a reservoir pool 18 of the molten material to be grown as a single crystal. A port 20 allows more material to be added to the reservoir pool 78, as needed. The neck 16 is a hollow cylinder which is vertically elongated upwardly above the crucible 14. For convenience, the neck 16 and the crucible 14 are typically constructed as a single axially symmetric piece (except for the port 20), but need not be so constructed. The container 12 is supported on a heavy base plate 70, and preferably fixed to the base plate 70 with a ring 72 of heat resistant epoxy.

An elongated, hollow, cylindrical temperature control tube 22 is locates within the neck 16. The temperature control tube 22 has an outer diameter less than the inner diameter of the neck 16, so that the tube 22 fits closely to, and can be inserted within, the neck 16. The clearance between the outer diameter of the tube 22 and the inner diameter of the neck 16 is sufficiently small that a good thermal contact is achieved. The upper end of the temperature control tube 22 reaches above the upper end of the neck 16. The lower end of the temperature control tube 22 extends below the lower end of the neck 16 and into the crucible 14. The lower end of the temperature control tube 22 reaches to a level of the crucible 14 that will remain below the anticipated surface level of the reservoir pool 18 at the end of the crystal growth process. Alternatively stated, when the apparatus 10 is in use, the level of molten material in the reservoir pool 78 must be maintained above the lower end of the temperature control tube 22. The temperature control tube 22 does not move in respect to the container 12. Preferably, the temperature control tube 22 is bonded directly to the neck 16 with an adhesive that withstands the anticipated use temperature. In the illustrated preferred embodiment, a ring of adhesive 24, such as a high temperature epoxy, at the upper end of the neck 16 joins the neck 16 to the sidewall of the temperature control tube 22.

An elongated, hollow, cylindrical crystal growth tube 26 is locates within the neck 16, and within the temperature control tube 22. The crystal growth tube 26 has an outer diameter less than the inner diameter of the temperature control tube 22, so that the tube 26 can be inserted into the tube 22. The upper end of the crystal growth tube 26 reaches above the upper end of the neck 16 and the upper end of the temperature control tube 22. Initially, and as illustrated in FIG. 1, the lower end of the crystal growth tube 26 extends below the lower end of the neck 16, below the lower end of the temperature control tube 22, and into the crucible 14. The lower end of the temperature control tube 22 reaches to a level of the crucible 14 that is below the anticipated surface level of the reservoir pool 78. Alternatively stated, when the apparatus 10 is in use, the level of molten material in the reservoir pool 78 must be maintained above the lower end of the temperature control tube 22. As crystal growth proceeds, the crystal growth tube 26 is withdrawn upwardly and eventually no longer contacts the surface level of the reservoir pool 78. Molten material continues to flow into the crystal growth tube 26, however, due to the upward flow in the temperature control tube 22.

The clearance between the outer diameter of the tube 22 and the inner diameter of the neck 16 is selected to be such that the crystal growth tube 26 will can slide freely within the temperature control tube 22 and also maintain good thermal contact. Indeed, during the crystal growing operation, the tube 26 is gradually moved upwardly relative to the temperature control tube 22. The spacing between the outer wall of the crystal growth tube 26 and the inner wall of the temperature control tube 22 is of a dimension such that the tube 26 is guided smoothly as it is moved relative to the tube 22. This dimension is also such that the molten material in the reservoir pool 78 can rise upwardly within the space between the outer wall of the tube 26 and the inner wall of the tube 22, as by the capillary action that draws liquids upwardly in a confined space. The actual value of this dimension between the outer wall of the tube 26 and the inner wall of the tube 22 is dependent upon the material in the reservoir pool 78. For organic materials such as metanitroaniline and orthonitroaniline, the dimension preferably is from about 0.002 to about 0.004 inches, most preferably about 0.002 inches. With the dimension so selected, in operation the material in the reservoir pool 78 rises upwardly to form a liquid film 28 between the tubes 22 and 26, to a flim meniscus 30. The film 28 helps to stabilize the temperature of the material within the tube 26, inasmuch as its small thickness dimension will not permit convention currents which would tend to create longitudinal thermal gradients within the film 28. The film 28 is typically maintained at a temperature just above the melting point of the material, usually about 3° C. above the melting point.

The material of the reservoir pool 78 also rises upwardly in the central cylindrical opening of the crystal growth tube 26, to a point near its upper end 32. As the height of molten material reaches near to the upper end 32, it encounters a lower temperature, which stops the rising of the molten material by freezing it to form the solid crystal. For an inner diameter of the crystal growth tube 26 of 0.001 inch and the material in the reservoir pool 18 of metanitroaniline, the upper end 32 is about 0.25 inches above the upper end of the tube 22.

The top of the crystal growth tube 26 is attached to a crystal puller 34 of any appropriate type. A crystal puller is generally any device that moves a solidifying crystal out of the hot zone of a furnace at a precisely controllable speed. In the present case, the crystal puller 34 includes a controllable motor 36 that is adjustable to turn at a range of relatively slow rates. The output of the motor 36 is directed through a reducing gear 38, and thence through a belt drive 40 to a pulley 42. The pulley 42 turns even more slowly than the motor 36. A support line 44 is wound around the pulley 42, so that the turning of the pulley 42 either draws the line 44 inwardly or pays it out. The distal end of the line 44 is attached to the crystal growth tube 26, preferably at its upper end. Thus, by operating the motor 36, the crystal growth tube 26 can be drawn upwardly and out of the container 12, the neck 16, and the temperature control tube 22.

The container 12 is heated by two separate heaters. The heaters are preferably coils of oxidation resistant, high-resistance materials such as nichrome or constantan. When an electrical current is passed through either heater, the wire heats ohmically, thereby heating the substrate upon which it is supported. A first heater 46 is wound around the crucible 14, and a second heater 48 is wound around the neck 16. The heaters 46 and 48 are fixed to the surfaces of the crucible 14 and neck 16, respectively, with a heat resistant epoxy. Thermocouples 50 and 52 are provided adjacent the crucible 14 and the neck 16, respectively, to measure their temperatures. It is necessary to be able to monitor and control the temperatures of the crucible 14 and the neck 16 independently.

The container 12 is preferably placed within a baffle box 54. The baffle box 54 is a box that prevents external physical contact with the container 12, and also prevents room drafts and other external effects from introducing temperature gradients to the crystal growth tube 26 and its contents. The baffle box 54 typically is constructed with a cylindrical sidewall 56 that sits upon the base 70, and a lid 58 having a central opening 60 therethrough, so that the tubes 22 and 26 can protrude through the lid 58.

In the preferred application of the apparatus 10, single crystals of optically nonlinear crystals are grown. The crystals are formed of organic materials such as metanitroaniline, orthonitroaniline, 2,methyl-4,nitroaniline, benzil, or urea. These organic materials have melting points near 100° C. The apparatus 10 for growing such crystals is constructed with the container 12, the temperature control tube 22, the crystal growth tube 26, and the baffle box 54 made of glass. The base plate 70 is alumina. The heaters 46 and 48 are nichrome, and the thermocouples 50 and 52 are chromel-alumel. The components of the crystal puller 34 are selected so that the growth speed is from about $\frac{1}{2}$ to about 2 inches per hour. The crucible 14 is $1\frac{1}{2}$ inches in diameter and $1\frac{1}{2}$ inches high. The neck 16 extends about 7 inches in height above the crucible 14. The inner diameter of the neck 16 is 0.56 inches. The outer diameter of the temperature control tube 22 is 0.050 inches, the inner diameter of the temperature control tube 22 is 0.015 inches, the outer diameter of the crystal growth tube 26 is 0.006 inches, and the inner diameter of the crystal growth tube 26 is 0.001 inches. The inner diameter of the crystal growth tube may be varied to obtain crystals of various diameters clad in glass. These materials of construction and dimensions are presented to indicate the preferred construction of the apparatus 10 for the preferred application, and should not be taken as limiting the invention in any respect.

In operation, the apparatus 10 is charged with the material to be grown into a crystal. The heaters 46 and 48 are turned on, and the heater 48 adjusted to a temperature a few degrees hotter than the heater 46. The current in the heater 46 is adjusted to heat the crucible 14 to the melting point of the material, to form the reservoir pool 78. The current in the heater 48 is adjusted to heat the neck 16 and the interior thereof to a temperature a few degrees higher than that of the crucible 14. After the temperatures have equilibrated and the molten liquid levels adjusted themselves, the crystal puller 34 is turned on so that the crystal growth tube 26 is moved upwardly out of the container 12 at the desired rate of crystal growth. Of course, care must be taken to be certain that the level of the molten material in the reservoir pool 78 is above the bottom end of the crystal growth tube 26, during the entire crystal growth process.

The following examples are presented to illustrate aspects of the invention, but should not be taken as limiting of the invention in any respect.

EXAMPLE 1

A single crystal of orthonitroaniline, which has a melting point of 71.5° C., was grown inside a crystal growth tube having an inner diameter of 0.002 inches. The clearance between the outer wall of the crystal growth tube and the inner wall of the temperature control tube was 0.003 inches. The crucible was heated to a temperature of about 72° C., and the neck was heated to a temperature of about 75° C. The rate of withdrawal of the crystal growth tube was 0.8 inches per hour. The resulting crystal was 8 inches long.

EXAMPLE 2

A single crystal of metanitroaniline, which has a melting point of 114° C., was grown. The dimensions of the apparatus were identical to those indicated in Example 1. The crucible was heated to a temperature of 114° C., and the neck was heated to a temperature of 117° C. The rate of withdrawal of the crystal growth tube was 0.8 inches per hour. The resulting crystal was 7 inches long.

It will now be understood that the apparatus and procedure of the invention can be used to produce very fine single crystals clad in glass envelopes. The apparatus achieves improved temperature stability during crystal growth, as compared with other types of apparatus, with the result that the crystals are more perfect than crystals produced by other techniques. Although a particluar embodiment of the invention has been described in detail for purposes of illustration, various modifications may be made without departing from the spirit and scope of the invention. Accordingly, the invention is not to be limited except as by the appended claims.

What is claimed is:

1. A crystal growing apparatus comprising:
   (a) a container comprising a crucible adapted to contain a supply of growth material, and a hollow cylindrical neck having an upper and lower end, said neck being vertically elongated and extending above and connected to said crucible;
   (b) heating means for heating the contents of said container, said heating means including a first heater affixed to the surface of the crucible and a second heater affixed to the surface of the neck along its entire length;
   (c) a hollow cylindrical temperature control tube having an inner and outer diameter, and an upper and lower end, and having an outer diameter less than the inner diameter of the neck to permit insertion of the tube within the neck, the upper end of the tube extending above the upper end of the neck, and the lower end of the tube extending below the lower end of the neck into the growth material just below its surface, the tube and the neck are positioned so as to achieve good thermal contact;
   (d) means of affixing the temperature control tube within neck;
   (e) a cylindrical crystal growth tube having an inner and outer diameter, and an upper and lower end located within the temperature control tube, the crystal growth tube having an outer diameter less than the inner diameter of the temperature control tube, to enable insertion of the growth tube into the temperature control tube, and to provide free upward and downward movement of the growth tube within the control tube, the upper end of the crystal growth tube extending above the upper end of the neck and the temperature control tube, and the lower end of the crystal growth tube extends below the lower end of the temperature control tube;
   (f) means for providing upward and downward movement of the crystal growth tube at a controlled rate;
   (g) means for keeping the growth material at a level above the lower end of the temperature control tube so that as crystal growth proceeds, the crystal growth tube is withdrawn upwardly and no longer extends into the growth material.

2. The apparatus of claim 1 further including a baffle box enclosing said container.

3. The apparatus of claim 1, wherein said crystal growth tube is made of glass.

4. The apparatus of claim 1, wherein said container, said temperature control tube, and said crystal growth tube are made of glass.

5. The apparatus of claim 1, wherein said first heater comprises resistance wire wound on the outside surface of said crucible, and said second heater comprises resistance wire wound on the outside surface of said neck.

6. The apparatus of claim 1, wherein the inner diameter of said crystal growth tube is less than about 0.001 inches.

7. The apparatus of claim 1, wherein the spacing between the outer wall of said crystal growth tube and the inner wall of said temperature control tube is less than about 0.005 inches.

8. Crystal growing apparatus, comprising:
   an enlarged container having a crucible adapted for containing a supply of a growth material to be grown into a crystal, and a vertically elongated neck having an upper and lower end, and an inner and outer diameter extending above said crucible;
   a first heater comprising resistance wire wound around the outside surface of said crucible;
   a second heater comprising resistance wire wound around the outside surface of said elongated neck;
   a hollow cylindrical temperature control tube having an inner and outer diameter, and an upper and lower end within said neck and extending downwardly into said crucible below the lower end of the neck and into the growth material, said temperature control tube being fixed to said neck at the upper end of said neck and the outer diameter of the control tube being smaller than the inner diamter of the neck;
   a hollow cylindrical crystal growth tube disposed within said elongated neck and said temperature control tube, said crystal growth tube being of a size to permit free upward and downward movement within said temperature control tube the spacing between the outer diameter of said crystal growth tube and the inner diameter of said temperature control tube being sufficiently small such that molten crystal material is drawn upwardly by capillary action into the space between said crystal growth tube and said temperature control tube;

a crystal puller connected to said crystal growth tube to provide upward and downward movement of the growth tube said crystal puller being adpated to withdraw said crystal growth tube from said temperature control tube at a constant rate of withdrawal; and a baffle box surrounding said container and having an opening in the top thereof so that said crystal growth tube and said temperature control tube extend therethrough.

9. The apparatus of claim 8, wherein said container, said temperature control tube, said crystal growth tube, and said baffle box are made of glass.

10. The apparatus of claim 8, wherein the inner diameter of said crystal growth tube is less than about 0.001 inches.

11. The apparatus of claim 8, wherein the spacing between the outer diameter of sai crystal growth tube and the inner diameter of said temperature control tube is less than about 0.005 inches.

12. The apparatus of claim 8, further including a supply of the growth material contained within said crucible.

13. The apparatus of claim 12, wherein said growth material is selected from the group consisting of metanitroaniline, orthonitroaniline, 2,methyl-4,nitroaniline, benzil, and urea.

* * * * *